(12) United States Patent
Hagiwara et al.

(10) Patent No.: US 8,431,914 B2
(45) Date of Patent: Apr. 30, 2013

(54) METHOD AND SYSTEM FOR MANUFACTURING A SURFACE USING CHARGED PARTICLE BEAM LITHOGRAPHY WITH VARIABLE BEAM BLUR

(75) Inventors: Kazuyuki Hagiwara, Tokyo (JP); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 266 days.

(21) Appl. No.: 12/862,741

(22) Filed: Aug. 24, 2010

(65) Prior Publication Data

US 2011/0053093 A1 Mar. 3, 2011

Related U.S. Application Data

(60) Provisional application No. 61/237,290, filed on Aug. 26, 2009.

(51) Int. Cl.
*G03F 1/00* (2012.01)

(52) U.S. Cl.
USPC .......... 250/492.3; 250/396 R; 250/398; 250/492.1; 250/492.2; 250/492.22; 430/5; 430/30; 430/296; 430/396; 430/397; 716/53; 716/55

(58) Field of Classification Search ........... 250/396 R, 250/398, 491.1, 492.1, 492.2, 492.22, 492.23, 250/492.3, 493.1; 430/5, 30, 296, 396, 397, 430/942; 716/53, 55
See application file for complete search history.

(56) References Cited

U.S. PATENT DOCUMENTS

| 3,768,124 | A | | 10/1973 | Maynard |
| 4,438,336 | A | | 3/1984 | Riecke |
| 4,818,885 | A | | 4/1989 | Davis et al. |
| 5,173,582 | A | | 12/1992 | Sakamoto et al. |
| 5,334,282 | A | * | 8/1994 | Nakayama et al. .......... 430/296 |
| 5,744,810 | A | | 4/1998 | Satoh |

(Continued)

FOREIGN PATENT DOCUMENTS

| EP | 1429368 A2 | 6/2004 |
| JP | 03205815 A | 9/1991 |

(Continued)

OTHER PUBLICATIONS

Office Action dated Oct. 26, 2011 for U.S. Appl. No. 12/898,646.

(Continued)

*Primary Examiner* — Michael Logie
(74) *Attorney, Agent, or Firm* — The Mueller Law Office, P.C.

(57) ABSTRACT

A charged particle beam writer system is disclosed comprising a generator for a charged particle beam having a beam blur radius, wherein the beam blur radius may be varied from shot to shot, or between two or more groups of shots. A method for fracturing or mask data preparation or optical proximity correction is also disclosed comprising assigning a beam blur radius variation to each calculated charged particle beam writer shot. A method for forming a pattern on a surface is also disclosed comprising using a charged particle beam writer system and varying the beam blur radius from shot to shot. A method for manufacturing an integrated circuit using optical lithography is also disclosed, comprising using a charged particle beam writer system to form a pattern on a reticle, and varying the beam blur radius of the charged particle beam writer system from shot to shot.

27 Claims, 5 Drawing Sheets

U.S. PATENT DOCUMENTS

| | | | |
|---|---|---|---|
| 6,037,601 | A | 3/2000 | Okunuki |
| 6,525,328 | B1 | 2/2003 | Miyoshi et al. |
| 6,768,124 | B2 | 7/2004 | Suzuki et al. |
| 6,815,693 | B2 | 11/2004 | Kamijo et al. |
| 6,891,175 | B2 | 5/2005 | Hiura |
| 7,176,470 | B1 | 2/2007 | Evans et al. |
| 7,378,668 | B2 | 5/2008 | Tanimoto et al. |
| 7,397,053 | B2 | 7/2008 | Mizuno |
| 7,453,063 | B2 | 11/2008 | Ottens et al. |
| 7,550,749 | B2 | 6/2009 | Caliendo et al. |
| 7,707,541 | B2 | 4/2010 | Abrams et al. |
| 7,745,078 | B2 | 6/2010 | Fujimura et al. |
| 7,754,401 | B2 | 7/2010 | Fujimura et al. |
| 7,759,026 | B2 | 7/2010 | Fujimura et al. |
| 7,759,027 | B2 | 7/2010 | Fujimura et al. |
| 7,901,850 | B2 | 3/2011 | Fujimura et al. |
| 7,985,514 | B2 | 7/2011 | Fujimura et al. |
| 8,039,176 | B2 | 10/2011 | Fujimura et al. |
| 2001/0019812 | A1 | 9/2001 | Yamaguchi et al. |
| 2002/0005494 | A1* | 1/2002 | Kamijo et al. .............. 250/491.1 |
| 2002/0042009 | A1 | 4/2002 | Suzuki |
| 2002/0125444 | A1 | 9/2002 | Kojima |
| 2003/0043358 | A1* | 3/2003 | Suganuma et al. .............. 355/53 |
| 2003/0059716 | A1* | 3/2003 | Simizu .......................... 430/296 |
| 2003/0077530 | A1* | 4/2003 | Fujiwara et al. ................ 430/30 |
| 2004/0011966 | A1* | 1/2004 | Sasaki et al. ................ 250/492.1 |
| 2005/0091632 | A1 | 4/2005 | Pierrat et al. |
| 2007/0023703 | A1 | 2/2007 | Sunaoshi et al. |
| 2007/0114463 | A1 | 5/2007 | Nakasugi et al. |
| 2007/0263921 | A1* | 11/2007 | Nakasugi et al. .............. 382/145 |
| 2010/0055580 | A1 | 3/2010 | Fujimura et al. |
| 2010/0055587 | A1 | 3/2010 | Fujimura et al. |
| 2010/0227200 | A1 | 9/2010 | Miyata et al. |
| 2010/0264335 | A1 | 10/2010 | Hoyle et al. |

FOREIGN PATENT DOCUMENTS

| | | | |
|---|---|---|---|
| JP | 2000091191 | A | 3/2000 |
| WO | 03036386 | A2 | 5/2003 |
| WO | 2010025031 | A2 | 3/2010 |
| WO | 2010025061 | A2 | 3/2010 |

OTHER PUBLICATIONS

Hattori, K. et al., "Electron Beam Direct Writing System EX-8D Employing Character Projection Exposure Method", Journal of Vacuum Science Technology, vol. B11(6) (1993), pp. 2346-2351, 1993, American Vacuum Society, 125 Maiden Lane, 15th Floor, New York, NY 10038.

Nakasugi, T. et al. "Maskless Lithography Using Low Energy Electron Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038.

U.S. Appl. No. 12/860,814, filed Aug. 10, 2010, entitled "Method and system for manufacturing a surface using character projection lithography with variable magnification", Fujimura.

Notice of Allowance Dated Jun. 17, 2011 for U.S. Appl. No. 12/618,722.

Office Action dated Jul. 8, 2011 for U.S. Appl. No. 12/898,646.

Extended European Search report dated Apr. 28, 2011 for EPO Application No. 10173794.8.

International Search Report and Written Opinion for International Application No. PCT/US2010/051393 dated May 30, 2011.

Nishimura, S. et al. "Development of a mask-scan electron beam mask writer", Journal of Vacuum Science & Technology B (Microelectronics and Nanometer Structures). vol. 20, No. 6, Nov. 1, 2002, pp. 2640-2645 XP002632946.

Notice of Allowance filed on Mar. 22, 2011 for U.S. Appl. No. 12/603,580.

Office Action dated Mar. 24, 2011 for U.S. Appl. No. 12/618,722.

Office Action dated Mar. 30, 2012 for U.S. Appl. No. 12/898,646.

Office Action dated Apr. 25, 2012 for U.S. Appl. No. 13/269,497.

International Search Report and Written Opinion dated Dec. 3, 2010 for PCT/US2010/046559.

Notice of Allowance and Fees Due dated Jun. 1, 2012 for U.S. Appl. No. 13/274,346.

Office Action dated Jan. 31, 2013 for U.S. Appl. No. 13/631,941.

\* cited by examiner

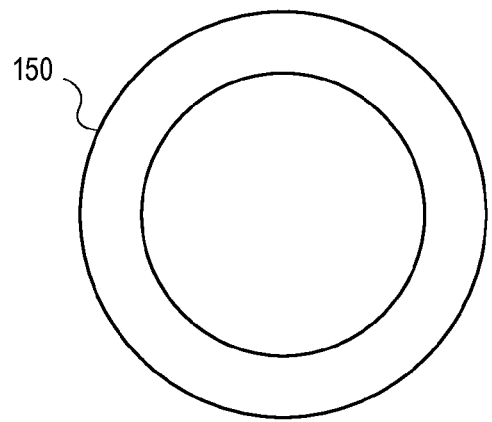
FIG. 3A
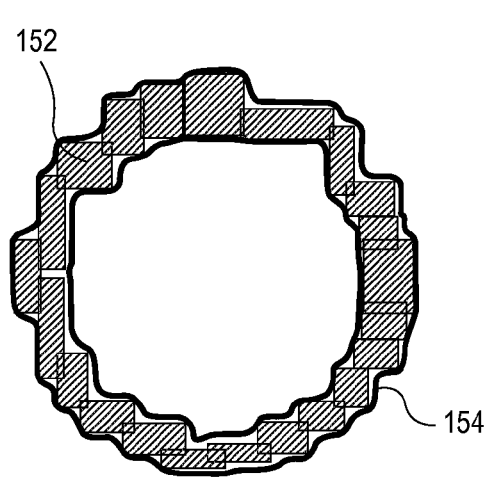 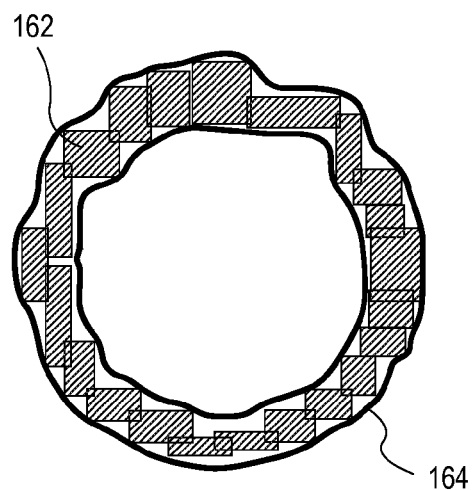
FIG. 3B  FIG. 3C

FIG. 4A

| 0.0 | 0.1 | 0.1 | 0.2 | 0.2 | 0.2 | 0.2 | 0.1 | 0.1 | 0.0 |
|---|---|---|---|---|---|---|---|---|---|
| 0.1 | 0.3 | 0.4 | 0.5 | 0.5 | 0.5 | 0.5 | 0.4 | 0.3 | 0.1 |
| 0.1 | 0.4 | 0.7 | 0.8 | 0.8 | 0.8 | 0.8 | 0.7 | 0.4 | 0.1 |
| 0.2 | 0.5 | 0.8 | 1.0 | 1.0 | 1.0 | 1.0 | 0.8 | 0.5 | 0.2 |
| 0.2 | 0.5 | 0.8 | 1.0 | 1.0 | 1.0 | 1.0 | 0.8 | 0.5 | 0.2 |
| 0.1 | 0.4 | 0.7 | 0.8 | 0.8 | 0.8 | 0.8 | 0.7 | 0.4 | 0.1 |
| 0.1 | 0.3 | 0.4 | 0.5 | 0.5 | 0.5 | 0.5 | 0.4 | 0.3 | 0.1 |
| 0.0 | 0.1 | 0.1 | 0.2 | 0.2 | 0.2 | 0.2 | 0.1 | 0.1 | 0.0 |

FIG. 4B

| 0.0 | 0.1 | 0.1 | 0.1 | 0.1 | 0.1 | 0.1 | 0.1 | 0.1 | 0.1 | 0.1 | 0.1 | 0.1 | 0.0 |
|---|---|---|---|---|---|---|---|---|---|---|---|---|---|
| 0.1 | 0.1 | 0.2 | 0.2 | 0.2 | 0.2 | 0.2 | 0.2 | 0.2 | 0.2 | 0.2 | 0.2 | 0.1 | 0.1 |
| 0.1 | 0.2 | 0.4 | 0.5 | 0.5 | 0.5 | 0.5 | 0.5 | 0.5 | 0.5 | 0.5 | 0.4 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.4 | 0.5 | 0.5 | 0.5 | 0.5 | 0.5 | 0.5 | 0.5 | 0.5 | 0.4 | 0.2 | 0.1 |
| 0.1 | 0.1 | 0.2 | 0.2 | 0.2 | 0.2 | 0.2 | 0.2 | 0.2 | 0.2 | 0.2 | 0.2 | 0.1 | 0.1 |
| 0.0 | 0.1 | 0.1 | 0.1 | 0.1 | 0.1 | 0.1 | 0.1 | 0.1 | 0.1 | 0.1 | 0.1 | 0.1 | 0.0 |

METHOD AND SYSTEM FOR MANUFACTURING A SURFACE USING CHARGED PARTICLE BEAM LITHOGRAPHY WITH VARIABLE BEAM BLUR

RELATED APPLICATIONS

This application claims priority from U.S. Provisional Patent Application Ser. No. 61/237,290 filed Aug. 26, 2009, entitled "Method and System For Manufacturing a Surface Using Charged Particle Beam Lithography"; which is hereby incorporated by reference for all purposes.

BACKGROUND OF THE DISCLOSURE

The present disclosure is related to lithography, and more particularly to the design of a charged particle beam writer system and methods for using the charged particle beam writer system to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms or magnetic recording heads.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits, either allowing an integrated circuit with the same number of circuit elements to be smaller and use less power, or allowing an integrated circuit of the same size to contain more circuit elements. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs is less than that for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

As the minimum feature size decreases along Moore's Law, and especially as features with dimensions less than 50 nm on the substrate are formed using optical lithography with a 193 nm illumination source with immersion technology, the OPC features on a photomask become very complex in shape. Specifically, it will not be practical to limit the shapes on a reticle to orthogonal and rectilinear shapes and still achieve a wafer fabrication process window sufficient to produce an acceptable process yield.

There are a number of technologies used for forming patterns on a reticle, including using optical lithography or charged particle beam systems. The most commonly used system is the variable shape beam (VSB) type, where a precise electron beam is shaped and steered onto a resist-coated surface of the reticle. These shapes are simple shapes, usually limited to rectangles of certain minimum and maximum sizes and triangles with their three internal angles being 45 degrees, 45 degrees, and 90 degrees of certain minimum and maximum sizes. The sides of the rectangles and the legs of the right triangles are parallel to the X, Y axes. At pre-determined locations, doses of electrons are shot into the resist with these simple shapes. The total writing time for this type of system increases with the number of shots. A second type of system is a character projection system, referred to as CP in this disclosure. In this case there is a stencil in the system that has in it a variety of shapes which may be rectilinear, arbitrary-angled linear, circular, annular, part circular, part annular, or arbitrary curvilinear shapes, and may be a connected set of complex shapes or a group of disjointed sets of a connected set of complex shapes. An electron beam can be shot through the stencil to efficiently produce more complex patterns (i.e. CP characters, sometimes referred to as characters) on the reticle. In theory, such a system could be faster than a VSB system because it can shoot more complex shapes with each time-consuming shot. There is currently, however, no CP electron beam writer system available for forming patterns on a reticle.

A shot comprises all the necessary instructions to specify which part of which character or VSB second aperture is to be shot at what location on the surface with what dose and what magnification. The instructions needed may take many forms, for example in a form directly corresponding to instructions for the charged particle beam writing system, such as deflection specifications of the various electrostatic or electromagnetic deflection shields. In other instances, the instructions may take the form of geometric descriptions of the desired shapes on the surface. In yet other circumstances, it may take the form of any other encoding which is sufficient to derive the required VSB, CP, or partial projection of a CP character with or without a specified dose, and with or without a specified magnification factor.

The use of VSB electron beam systems to form curvilinear patterns on a reticle with high fidelity is expensive, because a very large number of VSB shots are required to form the curvilinear shapes. Conventionally, reducing the VSB shot count results in lowering the fidelity of the curvilinear patterns that are formed, causing the patterns to become bumpier, meaning less smooth.

Thus, it would be advantageous to reduce the time and expense it takes to prepare and manufacture a reticle that is used for a substrate. More generally, it would be advantageous to reduce the time and expense it takes to prepare and manufacture any surface.

SUMMARY OF THE DISCLOSURE

A charged particle beam writer system is disclosed comprising a generator for a charged particle beam having a beam blur radius, wherein the beam blur radius may be varied from shot to shot, or between two or more groups of shots.

A method for fracturing or mask data preparation or optical proximity correction is also disclosed comprising assigning a beam blur radius variation to each calculated charged particle beam writer shot.

A method for forming a pattern on a surface is also disclosed comprising using a charged particle beam writer system and varying the beam blur radius from shot to shot, or between two or more groups of shots.

A method for manufacturing an integrated circuit using optical lithography is also disclosed, comprising using a charged particle beam writer system to form a pattern on a reticle, and varying the beam blur radius of the charged particle beam writer system from shot to shot, or between two or more groups of shots.

These and other advantages of the present disclosure will become apparent after considering the following detailed specification in conjunction with the accompanying drawings.

BRIEF DESCRIPTION OF THE DRAWINGS

FIG. 3A illustrates an example of an annular pattern that is desired to be formed on a surface;

FIG. 3B illustrates a nearly-annular pattern which can be formed on a surface with a set of 22 VSB shots using a 15 nm beam blur radius;

FIG. 3C illustrates a nearly-annular pattern which can be formed on a surface using the same VSB shots as FIG. 3B, but with a 30 nm beam blur radius;

FIG. 4A illustrates a glyph dosage map from a rectangular VSB shot;

FIG. 4B illustrates a glyph dosage map from a square VSB shot; and

DETAILED DESCRIPTION OF THE EMBODIMENTS

The improvements and advantages of the present disclosure can be accomplished by use of a charged particle beam writer system in which the beam blur radius can be adjusted for each shot or a series of shots, and by creating and using a shot list which contains a beam blur radius variation for each shot, or by creating and using a series of shot lists, with each list using a beam blur radius variation for all shots in the list.

Figure 1:
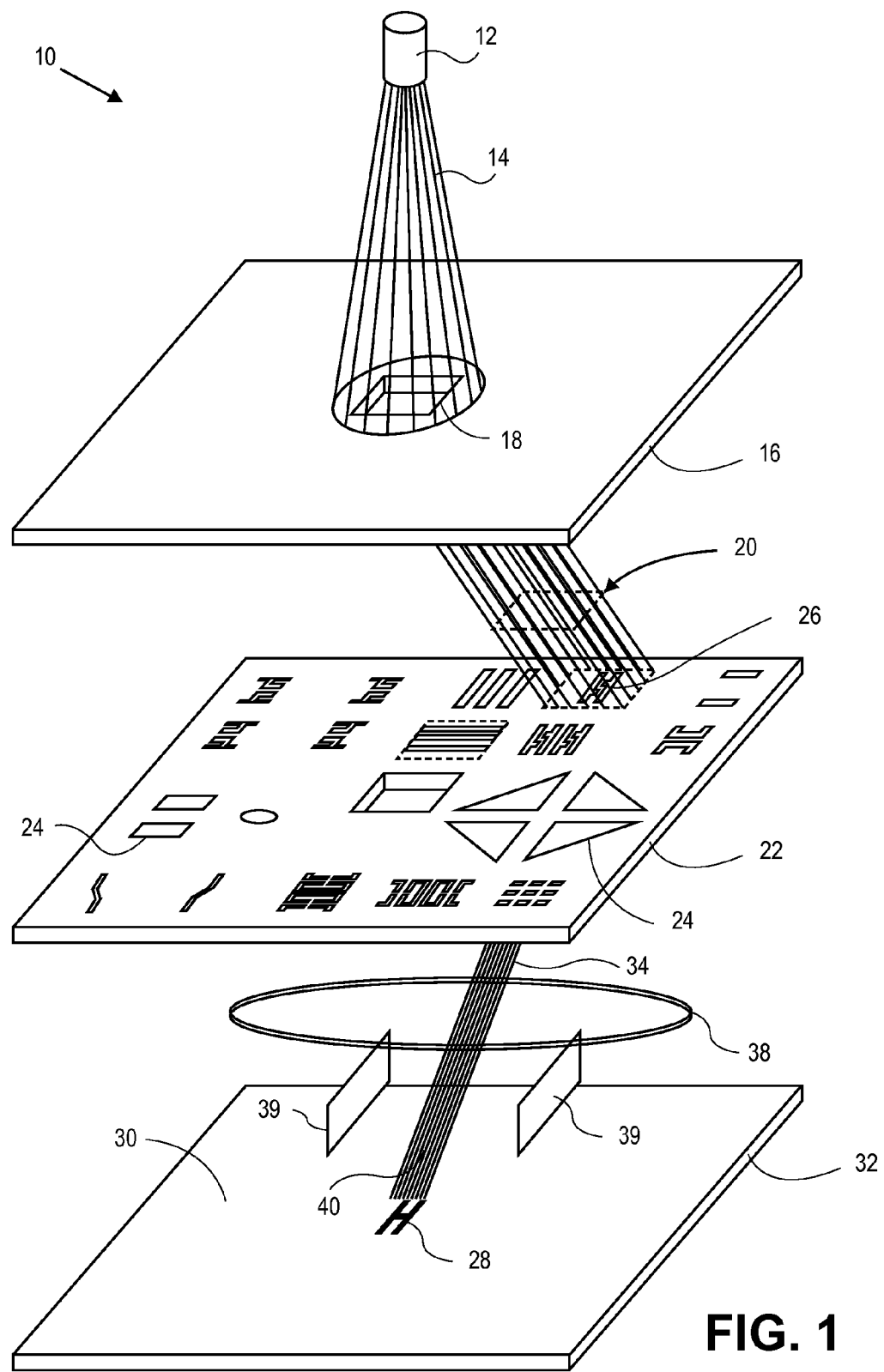
FIG. 1 illustrates a charged particle beam writer system used to manufacture a surface.

A charged particle beam writer system may comprise an input subsystem and a charged particle beam generator. The input subsystem reads a set of shots which are to be written by the generator, and may also sort or order the shots for optimal writing. Referring now to the drawings, wherein like numbers refer to like items, FIG. 1 illustrates the charged particle beam generator portion of a charged particle beam writer system, in this case an electron beam writer system that employs character projection to manufacture a surface 30. The charged particle beam generator 10 has an electron beam source 12 that projects an electron beam 14 toward an aperture plate 16. The plate 16 has an aperture 18 formed therein which allows the electron beam 14 to pass. Once the electron beam 14 passes through the aperture 18 it is directed or deflected by a system of lenses (not shown) as electron beam 20 toward another rectangular aperture plate or stencil mask 22. The stencil 22 has formed therein a number of openings or apertures 24 that define various types of characters 26. Each character 26 formed in the stencil 22 may be used to form a pattern 28 on a surface 30 of a substrate 32, such as a silicon wafer, a reticle or other substrate. In partial exposure, partial projection, partial character projection, or variable character projection, electron beam 20 may be positioned so as to strike or illuminate only a portion of character 26, thereby forming a pattern 28 that is a subset of character 26. An electron beam 34 emerges from one of the characters 26 and passes through an electronic reduction lens 38 which reduces the size of the pattern from the character 26. In commonly available charged particle beam writer systems, the reduction factor is between 10 and 60. The reduced electron beam 40 emerges from the reduction lens 38, and is directed by a series of deflectors 39 onto the surface 30 as the pattern 28, which is depicted as being in the shape of the letter "H". The pattern 28 is a reduced in size compared to the character 26 because of the reduction lens 38. The pattern 28 is drawn by using one shot of the electron beam system 10. This reduces the overall writing time to complete the pattern 28 as compared to using a variable shape beam (VSB) projection system or method. Although one aperture 18 is shown being formed in the plate 16, it is possible that there may be more than one aperture in the plate 16. Although two plates 16 and 22 are shown in this example, there may be only one plate or more than two plates, each plate comprising one or more apertures. In conventional charged particle beam writer systems the reduction lens is calibrated to provide a fixed reduction factor. The reduction lens 38 and/or the deflectors 39 also focus the beam on the plane of the surface 30. The size of the surface may be significantly larger than the maximum beam deflection capability of the deflection plates 39. Because of this, patterns are normally written on the surface in a series of stripes. Each stripe contains a plurality of sub-fields, where a sub-field is within the beam deflection capability of the deflection plates 39.

The minimum size pattern that can be projected with reasonable accuracy onto a surface 30 is limited by a variety of short-range physical effects associated with the electron beam writer system and with the resist coating on the surface 30. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum.

Figure 2A:
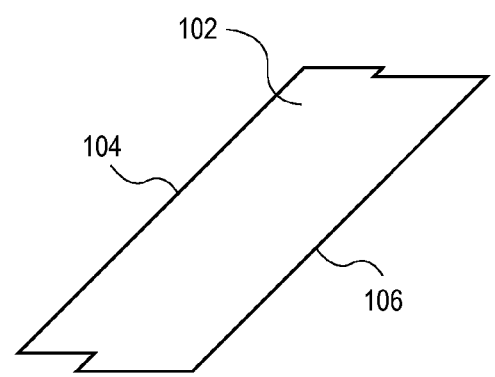
FIG. 2A illustrates an example of a portion of a 45 degree constant-width pattern that is desired to be formed on a surface.
Figure 2B:
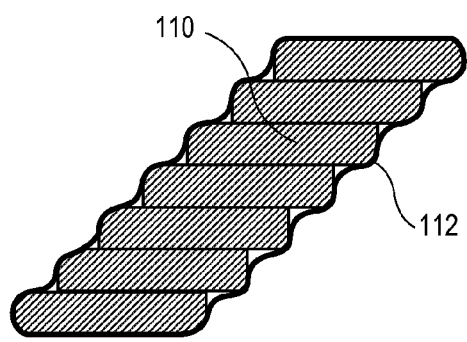
FIG. 2B illustrates a 45 degree pattern formed with VSB shots using a 20 nm forward scattering radius.
Figure 2C:
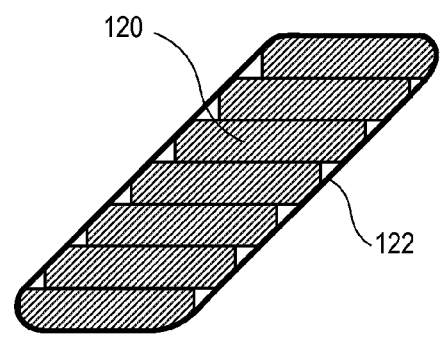
FIG. 2C illustrates a 45 degree pattern formed with VSB shots using a 40 nm forward scattering radius.

FIGS. 2A-C illustrate an example of using VSB shots to form a pattern on a surface. FIG. 2A illustrates a pattern 102, the pattern containing edges 104 and 106 which are angled at 45 degrees to the X and Y axes. FIG. 2B illustrates a set of seven VSB shots 110, where the height of each shot is 50 nm. The curvilinear outline 112 is the simulated pattern which would be formed on a surface with the set of shots 110 using a 20 nm beam blur radius. Similarly, FIG. 2C illustrates a set of seven VSB shots 120, each shot having a height of 50 nm. The curvilinear outline 122 is the simulated pattern which would be formed on a surface with the set of shots 120 using a 40 nm beam blur radius. As can be seen, the pattern 122 is smoother than the pattern 112, due to the larger beam blur radius of FIG. 2C compared to FIG. 2B. A pattern similar to pattern 122 could be formed on the surface using a 20 nm beam blur radius, but many more shots would be required than the seven shots 120 used to form pattern 122. The use of a larger beam blur radius may allow the formation of curvilinear patterns using significantly fewer shots than if a smaller beam blur radius is used. It should be noted that 20 nm and 40 nm beam blur radii are merely exemplary; other values are possible, with the actual values being determined by the amount of smoothing desired.

As described above, various short-range effects are grouped together, and collectively referred to as beam blur. An increase in beam blur from any source may allow similar reduction of shot count for forming curvilinear patterns. The novelty of the present invention is in allowing the electron beam writer system to be controlled in such a way that one or more of the mechanisms which minimize beam blur can be adjusted so that the beam blur radius is higher than the minimum value possible for that electron beam writer system. Provision for varying the beam blur radius may use either or both of two methods: a) the control of the beam blur radius may be directly through the shot data, in which each shot comprises a beam blur radius variation; or b) control of the beam blur radius may be via a separate control stream, which may, for example, specify a beam blur radius for each of a plurality of shot data input streams or shot lists. In one embodiment, the focus of a charged particle beam, such as an electron beam, may be adjusted so as to fall above or below the plane of the surface 30. In another embodiment the lenses or deflector through which the particle beam 20 passes before reaching the stencil 22 may be adjusted to increase beam blur. In another embodiment, the deflector 39 may be adjusted to increase beam blur. In yet another embodiment, the beam current may be increased to increase beam blur. A combination of more than one of these embodiments may also be used.

The improvement seen in FIG. 2C pattern 122 compared to FIG. 2B pattern 112 is due to the larger beam blur radius of FIG. 2C acting as a low-pass filter, smoothing out the features of the pattern as formed on the surface. The present invention takes advantage of this effect to produce smoother curvilinear and non-orthogonal patterns on a surface using fewer shots than would be required to produce a similarly-precise pattern using the minimum-available beam blur radius. Although VSB shots are illustrated in FIGS. 2B&C, the shots may also be CP shots or CP shots using partial projection. The effect is particularly pronounced when overlapping combinations of VSB, circular, near-circular, annular, or near-annular shots, or when overlapping oval variations of circular, near-circular, annular, or near-annular shots to form patterns on a surface.

Thus, a charged particle beam writing system, such as an electron beam system, which has the capability of varying the beam blur radius while shooting a pattern can have the effect of reducing the overall shot count compared to using a conventional charged particle beam writing system.

The ability to select the blur radius may require some additional settling time in between the shots. When one shot is made in the precision mode—i.e. with the smallest available beam blur radius, and the next shot is made with a larger beam blur radius, and the one after that with another beam blur radius, the time in between shots called the settling time may be required to be longer than shooting those VSB or CP or partial CP shots without changing the beam blur radius. The selection of beam blur levels may be continuously variable, or may have discrete possibilities, including perhaps only "precision" and "high beam blur". In an ideal case, the settling time required when changing the beam blur is no different from the normal settling time in between shots; the normal settling time being the shot-to-shot settling time when the beam blur radius is not changed. In one embodiment, if the settling time when changing the beam blur is within approximately a factor of two of the normal settling time, the shot sequence may be arranged so as to shoot as a group all of the shots within a subfield of any given blur radius, then the blur radius is changed, and then all shots with the next blur radius are shot as a group, and so on. In another embodiment, if the settling time to change blur radius is even longer, then the method of forming a pattern may include writing an entire stripe or perhaps writing the entire surface with all shots of one uniform beam blur radius together as a group, then changing to a second blur radius, and then writing the same stripe or the surface with the all the shots using the second beam blur radius, and so on, to minimize overall writing time. In any scenario where the settling time required is different from the normal settling time in between shots, it is desirable to limit the number of blur radius choices used to a small number, such as two. In one embodiment, the input subsystem of the charged particle beam system may sort the input shot data, grouping shots according to the beam blur radius variation of each shot, to optimize write time.

FIGS. 3A-C illustrate the effect of varying the beam blur radius when forming a curvilinear pattern. FIG. 3A illustrates an example of a curvilinear pattern 150 which is to be formed on a surface, the pattern 150 being an annulus or ring with a 55 nm inside radius and a 20 nm ring width. FIG. 3B illustrates an example of how a nearly-annular pattern 154 may be formed on a surface using a set of 22 VSB shots 152 using a 15 nm beam blur radius. FIG. 3C illustrates an example of another nearly-annular pattern 164, formed from the same set of 22 VSB shots 162, but using a 30 nm beam blur radius. As can be seen, the pattern 164 of FIG. 3C is more nearly annular than the pattern 154 of FIG. 3B. The use of a higher beam blur radius allows a more-accurate formation of the nearly annular pattern for a given shot count. Note that the number of shots and beam blur values used in FIGS. 3A-C are merely exemplary to demonstrate the beneficial effect of varying beam blur radius.

Glyph creation is the process of calculating a dosage map for a shot or group of shots and storing the shot information and the calculated dosage map for future use. The calculated dosage map represents the dosage that would be received by a resist-coated surface from the shot(s) comprising the glyph. FIGS. 4A&B illustrate examples of glyphs that may be used by optical proximity correction, fracturing, proximity effect correction, or any other steps of mask data preparation. FIG. 4A illustrates an example of a two-dimensional dosage map 200 of one rectangular VSB shot. The shot's nominal outline 202 is also shown. The nominal dosage of the VSB shot in this example is 1.0 times a normal dosage. The value shown in each grid represents the calculated fraction of a normal dosage that the surface will receive at an X, Y sample point on the surface. As can be seen, significant energy is recorded outside the nominal boundary of the VSB shot. If this glyph is shot onto a resist-coated surface which has a resist threshold of 0.6, with no other shots contributing significant dosage, the resist will register a pattern similar to the rectangular shot outline 202. FIG. 4B illustrates an example of a glyph dosage map 220 of a single square VSB shot, where the nominal shot outline 222 is also shown. The nominal dosage of the shot in this example is 0.6 times a normal dosage. If this glyph is shot onto a resist-coated surface which has a resist threshold of 0.5, with no other shots contributing significant dosage, the resist will register a pattern that is slightly smaller on all sides than the shot outline, and in which the corners of the pattern are rounded off. The dosage grids 200 and 220 are for illustration only, and are coarser than practical. Grid sizes between 1 nm and 40 nm, in the scale of the surface, may be useful for calculating glyph dosages for modern semiconductor processes. Additionally, in one embodiment of glyph creation, the dosages may not be stored as a two-dimensional dosage map as shown in 200 and 220, but may be stored as a set of instructions for creating a two-dimensional set of dosage values. Beam blur radius variation may be combined with other known shot varying techniques, including dosage variation, shot overlap, and CP character partial projection, to create glyphs.

Figure 5:
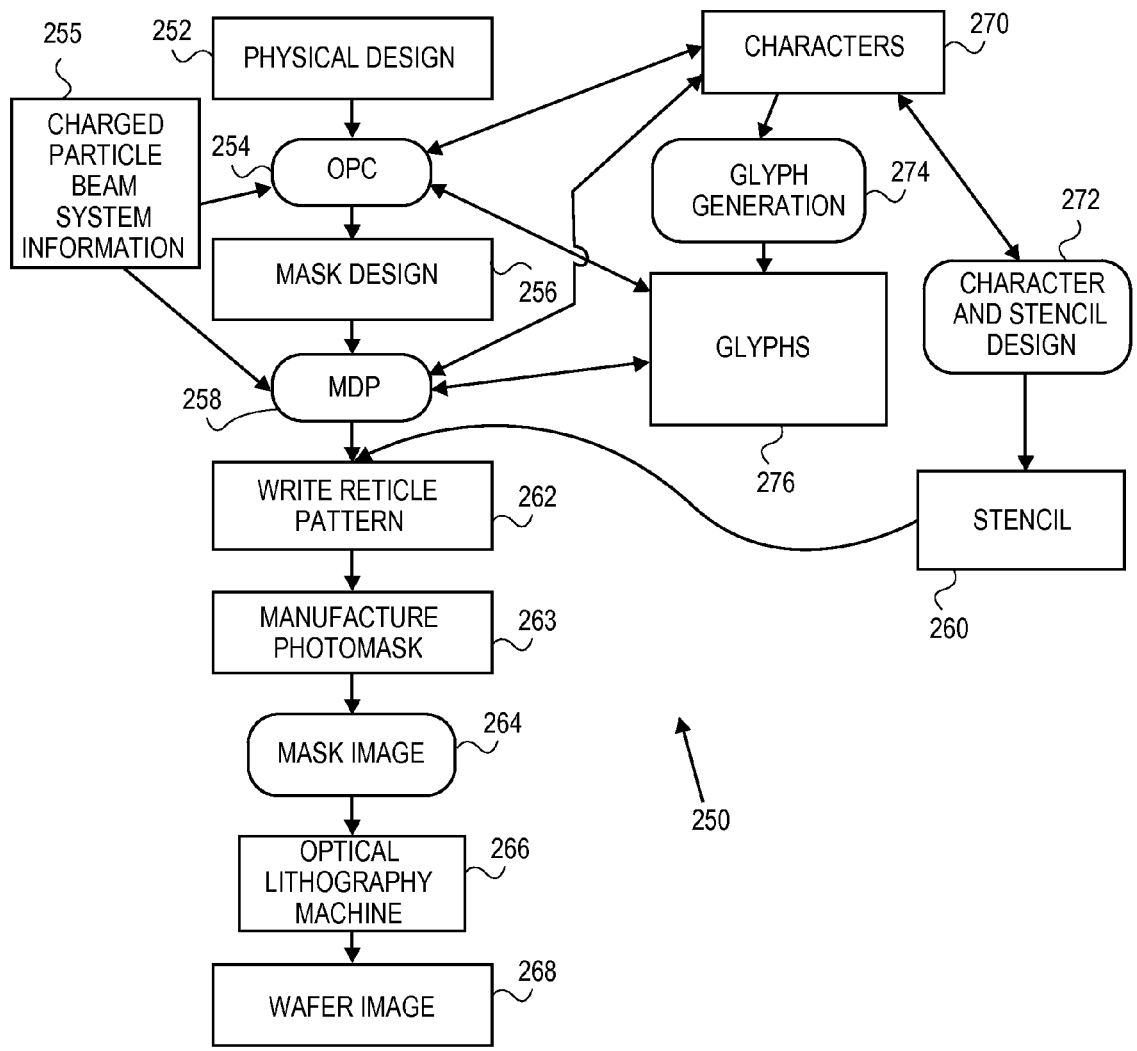
FIG. 5 illustrates an embodiment of a conceptual flow diagram of how to prepare a surface for use in fabricating a substrate such as an integrated circuit on a silicon wafer.

FIG. 5 is an exemplary conceptual flow diagram 250 of how to prepare a reticle for use in fabricating a surface such as an integrated circuit on a silicon wafer. In a first step 252, a physical design, such as a physical design of an integrated circuit, is designed. This can include determining the logic gates, transistors, metal layers, and other items that are required to be found in a physical design such as that in an integrated circuit. Next, in a step 254, optical proximity correction is (OPC) determined. In an embodiment of this disclosure this can include taking as input a library of glyphs 276. This can also alternatively, or in addition, include taking as input a library of pre-designed CP characters 270, including complex characters that are to be available on a stencil 260 in a step 262. In another embodiment of this disclosure, an OPC step 254 may also include simultaneous optimization of shot count or write times, and may also include a fracturing operation, a shot placement operation, a dose assignment operation, or may also include a shot sequence optimization operation, or other mask data preparation operations. In this embodiment, OPC step 254 may use charged particle beam writer system information 255, which may include the range or discrete values of beam blur radius which are available. Once optical proximity correction is completed a mask design is developed in a step 256. Then, in a step 258, a set of shots is determined in a mask data preparation (MDP) operation which may include a fracturing operation, a shot placement operation, a dose assignment operation, or a shot sequence optimization may take place. Either of the steps of the OPC step 254 or of the MDP step 258, or a separate program independent of these two steps 254 or 258 can include a program for determining a limited number of stencil characters that need to be present on a stencil or a large number of glyphs that can be shot on the surface with a small number of shots by combining characters that need to be present on a stencil with varying dose, position, and degree of partial exposure to write all or a large part of the required patterns on a reticle. It is to be understood throughout this disclosure that the mask data preparation step 258 does not include OPC. Combining OPC and any or all of the various operations of mask data preparation in one step is contemplated in this disclosure. Mask data preparation step 258 may include a fracturing operation, and may also comprise a pattern matching operation to match glyphs to create a mask that matches closely to the mask design. Mask data preparation may also comprise inputting patterns to be formed on a surface with the patterns being slightly different, selecting a set of CP characters to be used to form the number of patterns, the set of characters fitting on a stencil mask, and the set of characters based on varying character dose or varying character position or varying the beam blur radius or applying partial exposure of a character within the set of characters to reduce the shot count or total write time. Mask data preparation may also comprise using a combination of CP characters and VSB shots to form the number of patterns, where the CP characters may use partial exposure, and where either or both of the CP and VSB shots may vary the dosage or the beam blur radius. A set of slightly different patterns on the surface may be designed to produce substantially the same pattern on a substrate. Also, the set of CP characters may be selected from a predetermined set of characters. Mask data preparation step 258 may also include taking as input information about the charged particle beam writer, such as the range or discrete values of beam blur radius which are available. In one embodiment of this disclosure, a set of CP characters to be made available on a stencil, so that characters in the set may be selected quickly during the mask writing step 262, may be prepared for a specific mask design in step 272 and put into a CP character library 270. In that embodiment, once the mask data preparation step 258 is completed, a stencil is prepared in a step 260. In another embodiment of this disclosure, a stencil is prepared in the step 260 prior to or simultaneous with the MDP step 258 and may be independent of the particular mask design. In this embodiment, the characters available in the CP character library 270 and the stencil layout are designed in step 272 to output generically for many potential mask designs 256 to incorporate slightly different patterns that are likely to be output by a particular OPC program 254 or a particular MDP program 258 or particular types of designs that characterize the physical design 252 such as memories, flash memories, system on chip designs, or particular process technology being designed to in physical design 252, or a particular cell library used in physical design 252, or any other common characteristics that may form different sets of slightly different patterns in mask design 256. The stencil can include a set of characters, such as a limited number of characters that was determined in the step 258, including a set of adjustment characters. Once the stencil is completed the stencil is used in a charged particle beam writer system, such as an electron beam system, to form a pattern on the surface of a reticle in step 262. Each shot of the charged particle beam writer system may have a specified magnification. After the image is formed on the reticle, the reticle undergoes various processing steps 263 through which it becomes a photomask 264. The photomask may then be used in an optical lithography machine, which is shown in a step 266. Finally, in a step 268, a substrate such as a silicon wafer is produced. As has been previously described, characters in a CP character library 270 may be provided to the OPC step 254 or the MDP step 258. The CP character library 270 also provides characters to a character and stencil design step 272 or a glyph generation step 274. The character and stencil design step 272 provides input to the stencil step 260 and to the CP character library 270. The glyph generation step 274 provides information to a glyphs library 276. Also, as has been discussed, the glyphs library 276 provides information to the OPC step 254 or the MDP step 258.

Throughout this disclosure the terms "calculate" and "calculation" may include pre-computation, table look-up, constructive algorithms, greedy algorithms, and iterative improvement methods, in addition to normal deterministic methods such as an equation.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present charged particle beam writer system and methods for fracturing and for forming patterns using such a system may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A device for charged particle beam lithography comprising:
   an inputting device, wherein the inputting device reads information for a set of variable shaped beam (VSB) or character projection (CP) shots, and wherein the information for the set of shots comprises a beam blur radius variation; and
   a charged particle beam generator having a beam blur radius, wherein the beam blur radius is varied from shot to shot, or between two or more groups of shots, based on the beam blur radius variation in the shot information.

2. The device of claim 1 wherein each shot in the set of shots comprises a beam blur radius variation.

3. The device of claim 1 wherein the beam blur radius is varied by adjusting the plane of focus of the charged particle beam.

4. The device of claim 1 further comprising a character projection (CP) stencil containing a character pattern.

5. The device of claim 1 wherein a settling time for varying the beam blur radius of the charged particle beam is higher than a shot-to-shot settling time when the beam blur radius is not varied.

6. The device of claim 5 wherein ordering the set of shots comprises sorting the shots in the set by beam blur radius variation.

7. The method of claim 1 wherein the inputting device orders the shots in the set for efficient writing.

8. A method for fracturing or mask data preparation (MDP) or optical proximity correction (OPC) comprising:
   inputting patterns to be formed on a surface;
   determining a set of shots for a variable shaped beam (VSB) or character projection (CP) charged particle beam writer system to form the patterns, wherein the charged particle beam writer system has a beam blur radius that can be varied either shot to shot or between two or more groups of shots, and wherein the beam blur radius variation for a plurality of shots in the set of shots is calculated, and wherein the calculated beam blur radius variation is different between at least two shots in the set of shots; and
   outputting the beam blur radius variation information for the determined set of shots.

9. The method of claim 8 wherein the set of determined shots includes at least one character projection (CP) shot.

10. The method of claim 8 wherein the set of determined shots includes a plurality of variable shaped beam (VSB) shots.

11. The method of claim 8 wherein each shot in the set of shots comprises a beam blur radius variation.

12. The method of claim 8 wherein the step of outputting comprises separating shots in the set of shots into a plurality of groups, wherein each group of shots is associated with a unique beam blur radius variation.

13. The method of claim 8 wherein each shot in the set of shots comprises a dosage.

14. A method for forming a pattern on a surface comprising:
   using a variable shaped beam (VSB) or character projection (CP) charged particle beam writer system for forming the pattern on the surface, wherein the charged particle beam writer system comprises a charged particle beam generator having a beam blur radius;
   inputting information for a set of shots, wherein the information for the set of shots comprises a beam blur radius variation; and
   varying the beam blur radius of the charged particle beam writer system from shot to shot or between two or more groups of shots, based on the beam blur radius variation in the shot information.

15. The method of claim 14 wherein the set of shots includes a character projection (CP) shot.

16. The method of claim 14 wherein the set of shots includes a plurality of variable shaped beam (VSB) shots.

17. The method of claim 14 wherein in the step of inputting, each shot in the set of shots comprises a beam blur radius variation.

18. The method of claim 14 wherein in the step of inputting, the set of shots comprises multiple groups of shots, and wherein the shots in each group have the same beam blur radius variation.

19. The method of claim 14 wherein each shot in the set of shots comprises a dosage.

20. The method of claim 14 wherein varying the beam blur radius comprises shooting as a group all shots within a subfield, stripe or the entire surface which use a first beam blur radius, before changing to a second beam blur radius.

21. A method for manufacturing an integrated circuit using an optical lithographic process, the optical lithographic process using a reticle, the method comprising:
   using a variable shaped beam (VSB) or character projection (CP) charged particle beam writer system for forming a pattern on the reticle, the charged particle beam writer system having a beam blur radius;
   inputting information for a set of shots to be used to form the pattern on the reticle, wherein the information for the set of shots comprises a beam blur radius variation; and
   varying the beam blur radius of the charged particle beam writer system from shot to shot or between two or more groups of shots, based on the beam blur radius variation in the shot information.

22. The method of claim 21 wherein each shot in the set of shots further comprises a shot dosage.

23. The method of claim 21 wherein the set of shots includes a character projection (CP) shot.

24. The method of claim 21 wherein the set of shots includes a plurality of variable shaped beam (VSB) shots.

25. The method of claim 21 wherein each shot in the set of shots comprises a beam blur radius variation.

26. The method of claim 21 wherein in the step of inputting, the set of shots comprises multiple groups of shots, and wherein the beam blur radius variation is specified for each group of shots.

27. The method of claim 21 wherein varying the beam blur radius comprises shooting as a group all shots within a subfield, stripe or the entire surface which use a first beam blur radius, before changing to a second beam blur radius.

* * * * *